United States Patent
Chen et al.

(10) Patent No.: US 6,489,193 B1
(45) Date of Patent: Dec. 3, 2002

(54) PROCESS FOR DEVICE ISOLATION

(75) Inventors: Lung Chen, Hsinchu (TW); Teng-Feng Wang, Chang-Hua Hsien (TW); Zen-Long Yang, Hsinchu (TW); Shih-Hui Chang, Taipei (TW); Yung-Shin Wang, Taipei Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/040,442

(22) Filed: Jan. 9, 2002

(51) Int. Cl.[7] ............... H01L 21/8238; H01L 21/76
(52) U.S. Cl. ............... 438/222; 438/412; 438/432; 438/442
(58) Field of Search ............... 438/222, 226, 438/412, 413, 430, 432, 442

(56) References Cited

U.S. PATENT DOCUMENTS

| | | | | |
|---|---|---|---|---|
| 4,910,165 A | * | 3/1990 | Lee et al. | 438/226 |
| 5,893,745 A | * | 4/1999 | Park | 438/412 |
| 6,048,765 A | * | 4/2000 | Wu | 438/257 |
| 6,153,467 A | * | 11/2000 | Wu | 438/257 |
| 6,162,689 A | * | 12/2000 | Kepler et al. | 438/299 |

\* cited by examiner

*Primary Examiner*—Olik Chaudhuri
*Assistant Examiner*—David S Blum
(74) *Attorney, Agent, or Firm*—Birch, Stewart, Kolasch & Birch, LLP

(57) ABSTRACT

A novel process for isolating devices on a semiconductor substrate is disclosed. An isolation layer is first formed over the semiconductor substrate and patterned into at least two isolation mesas on the substrate. Next, a blanket semiconductor layer is formed over the substrate with a thickness sufficient to cover the isolation mesas. The semiconductor layer is subjected to planarization until the isolation mesas are exposed, thus resulting in a semiconductor region between the two isolation mesas to serve as an active region for semiconductor devices.

17 Claims, 3 Drawing Sheets

PROCESS FOR DEVICE ISOLATION

BACKGROUND OF THE INVENTION

1. Field of the Invention

The present invention relates in general to semiconductor manufacturing. In particular, the present invention relates to a process for isolating devices on a semiconductor substrate.

2. Description of the Related Arts

Integrated circuits are formed from semiconductor substrates, usually silicon (Si), within and upon whose surfaces are formed active semiconductor regions containing electrical circuit elements that are internally and externally connected to the substrate through multiple patterned conductor layers that are separated by dielectric layers. These active semiconductor regions must be otherwise electrically isolated from adjacent active semiconductor regions by the formation of intervening trenches which are subsequently filled with dielectric material to ensure such electrical isolation and avoid undesired interference between adjacent active semiconductor regions. The continued miniaturization of integrated circuit devices has resulted in smaller trenches formed by, for example, shallow trench isolation (STI) methods to form trench isolation regions essentially co-planar with adjacent active semiconductor regions of the semiconductor substrates.

However, for these increasingly miniaturized integrated circuits with corresponding miniaturized shallow isolation trenches, an undesired void, or keyhole, is formed within the gap filling silicon oxide layer within the trench. It is easy to form an overhead at the top corners of shallow trenches using traditional CVD-ox (chemical vapor deposition of silicon oxide) to gap filling and thus voids are formed. As shown in FIG. 1, a common problem associated with trench refill isolation is the formation of voids in the trenches. During refill of the trench 140 with dielectric material 160, the trench 140 often becomes constricted near the top of the trench, thereby preventing complete refill of the trench, resulting in a void 200. Void defects may trap contamination or make the final oxide surface of the STI (shallow trench isolation region) lower than the active surface. Also, junction leakage would increase. Increasing the trench width can alleviate void formation, however, it also undesirably decreases device density.

Accordingly, a need exists for a novel device isolation technique that allows high density integrated circuits to be fabricated with improved reliability.

SUMMARY OF THE INVENTION

It is therefore an object of the invention to provide a novel isolation process which overcomes the problem of void formation while providing effective device isolation.

To achieve the above and other objects, the present invention provides a novel isolation process where isolation regions are formed by depositing a blanket isolation layer over a semiconductor substrate and patterning the isolation layer, as opposed to the conventional trench isolation process where the isolation regions are formed by refilling isolation trenches. Thereby, the problem of void formation can be avoided. According to another feature of the invention, after forming the isolation regions, a semiconductor layer is provided between two isolation regions to serve as an active region where semiconductor devices are to be formed. In other words, semiconductor devices will be fabricated on the newly formed semiconductor layer instead of original substrate surface.

According to an aspect of the invention, there is provided a process for isolating devices on a semiconductor substrate, comprising the steps of forming an isolation layer over the semiconductor substrate; patterning the isolation layer into at least two isolation mesas; forming a semiconductor layer over the substrate with a thickness sufficient to cover the isolation mesas; and planarizing the semiconductor layer until the isolation mesas are exposed, whereby leaving a semiconductor region between the two isolation mesas to serve as an active region for semiconductor devices.

According to another aspect of the invention, there is provided a process for isolating devices on a semiconductor substrate, comprising the steps of forming an isolation layer over the semiconductor substrate; forming a photoresist layer over the isolation layer; patterning the photoresist layer to provide a mask that is substantially the reverse of predetermined active regions to be formed; anisotropically etching the isolation layer with the patterned photoresist layer as an etch mask, thereby forming a plurality of isolation mesas; removing the photoresist layer; forming a semiconductor layer over the substrate with a thickness sufficient to cover the isolation mesas; and planarizing the semiconductor layer until the isolation mesas are exposed, thereby leaving a plurality of semiconductor regions separated by the isolation mesas to serve as active regions for semiconductor devices.

BRIEF DESCRIPTION OF THE DRAWINGS

The above and other objects, features, and advantages of the present invention will become apparent from the following detailed description of preferred embodiments of the invention explained with reference to the accompanying drawings, in which.

Figure 1:
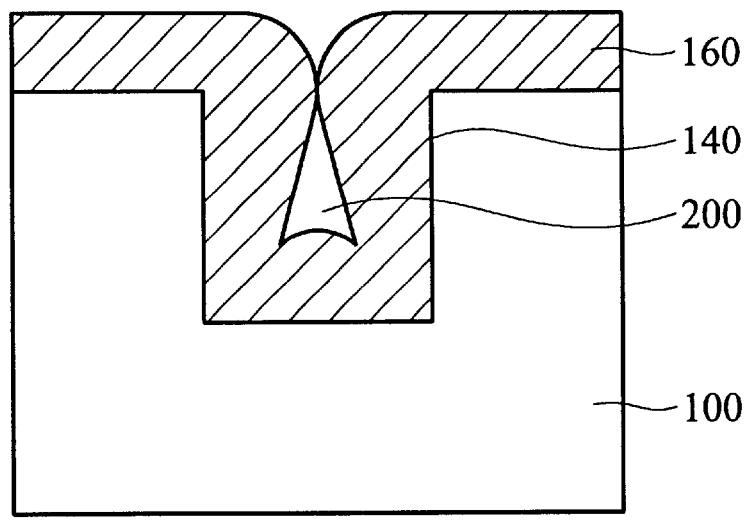
FIG. 1 is a schematic section of a trench refill having a void.

| REFERENCE NUMERALS IN THE DRAWINGS | | | |
|---|---|---|---|
| 10 | semiconductor substrate | 12 | oxide layer |
| 14 | nitride layer | 16 | isolation layer |
| 16a–16c | isolation mesas | 18 | photoresist pattern |
| 20 | semiconductor layer | 20a–20d | active regions |
| 22 | MOS transistors | 100 | semiconductor substrate |
| 140 | isolation trenches | 160 | dielectric material |
| 200 | void | | |

DESCRIPTION OF THE PREFERRED EMBODIMENTS

Figure 2:
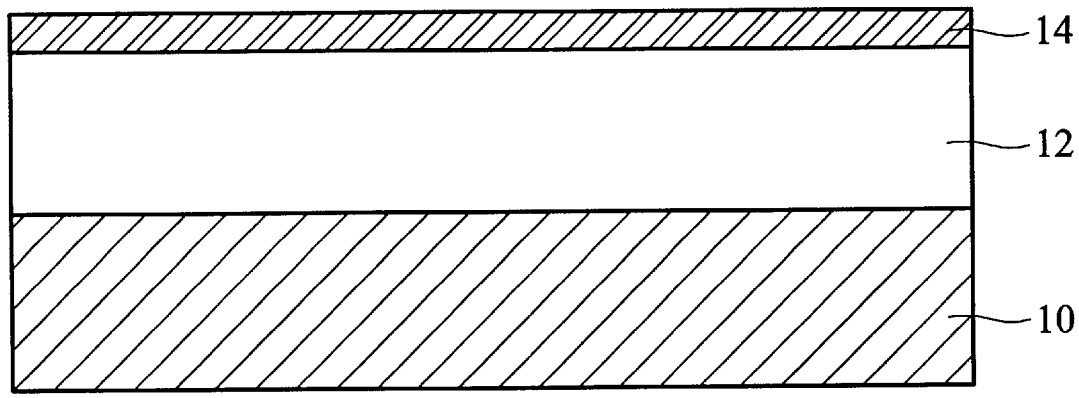
FIGS. 2–6 are schematic cross-sections illustrating the steps for isolating devices according to a preferred embodiment of the invention.

There will now be described an embodiment of this invention with reference to the accompanying drawings. FIG. 2 shows a semiconductor substrate 10 covered with an isolation layer 16 used for forming isolation regions. The isolation layer 16 may be selected from a variety of materials and can be a monolayer or stack dielectric layer. In this embodiment, the isolation layer 16 is composed of an oxide layer 12 and a nitride layer 14 overlying the oxide layer 12 to function as a polishing stop during the subsequent polishing process. In other embodiments, the isolation layer 16 is a monolayer which itself can serve as a polishing stop, for example, silicon nitride, silicon carbide, or diamond. The oxide layer 12 can be formed by thermal oxidation or by an atmospheric or low pressure chemical vapor deposition (LPCVD) process as is well known. The nitride layer 14 can be formed by reacting dichlorosilane ($SiCl_2H_2$) with ammonia ($NH_3$) through an LPCVD process. Preferably, the oxide layer 12 is deposited to a thickness of above 2,000 Å and the nitride layer 14 is deposited to a thickness of above 1,000 Å.

Figure 3:
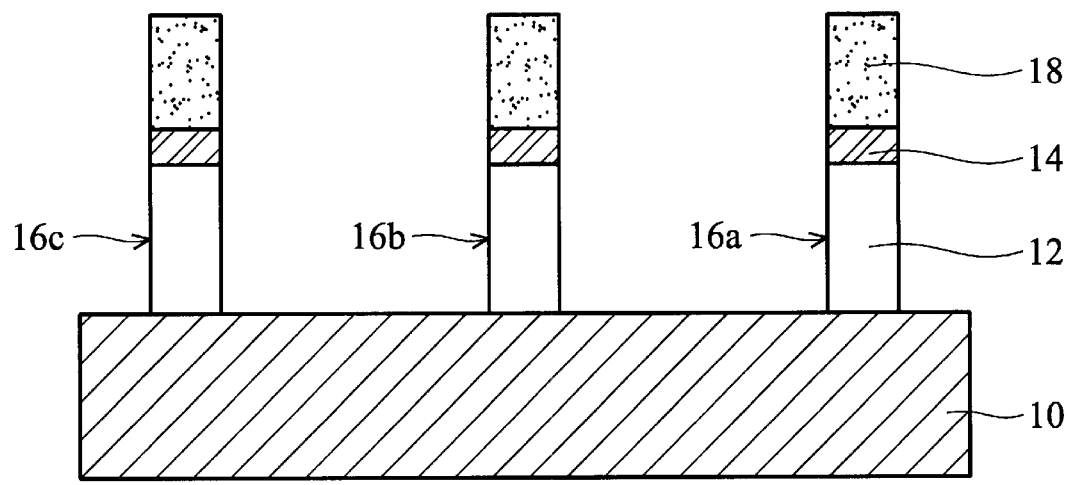
Figure 4:
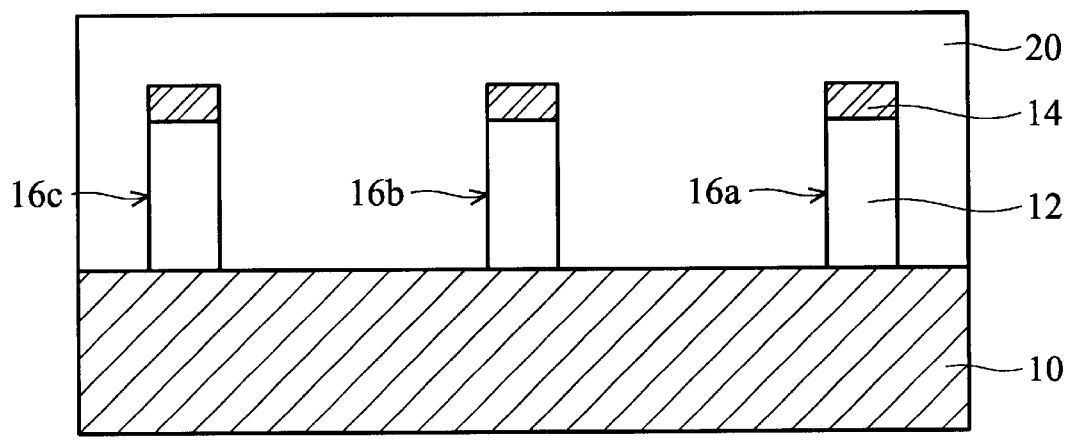

FIG. 3 shows a step of patterning the isolation layer 16 into a plurality of isolation mesas 16a, 16b, 16c on the substrate 10. The semiconductor substrate 10 is first covered with a material used for an etch mask, for example, photoresist. The photoresist layer is then patterned by use of the known lithography technology to provide a mask 18 that is substantially the reverse of predetermined active regions to be formed (i.e., so called "reverse active area mask"). Then, the nitride layer 14 and the oxide layer 12 are etched in sequence using the photoresist pattern 18 as an etch mask, thus forming the isolation mesas 16a, 16b, 16c as shown. The etch process may be by reactive ion etching, chemical plasma etching, or other like anisotropic etching techniques.

Figure 5:
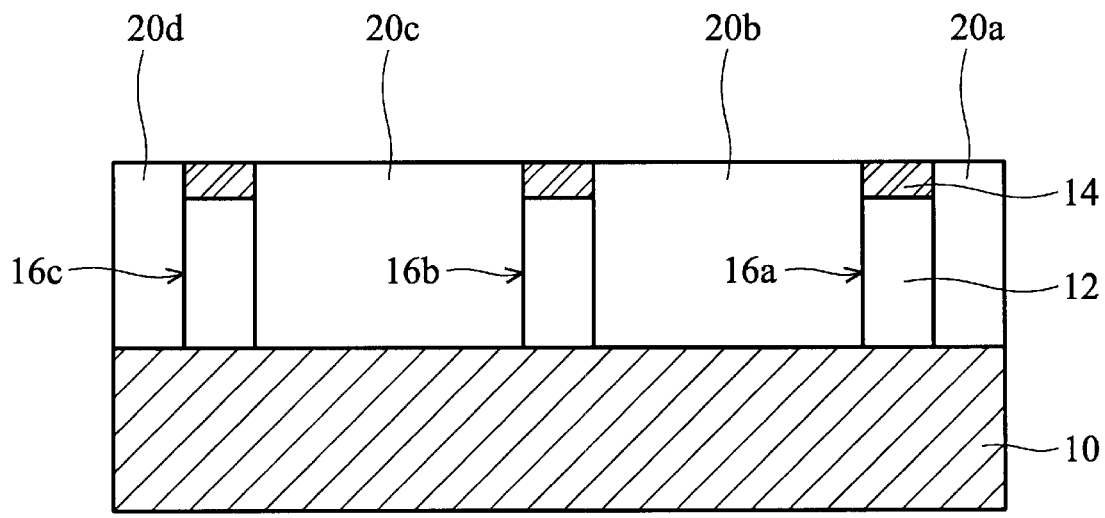

After removing the photoresist pattern 18, referring to FIG. 5, a blanket semiconductor layer 20 is formed over the substrate 10 with a thickness sufficient to cover the isolation mesas 16a, 16b, 16c. The semiconductor layer 20 can be, for example, an epitaxial silicon layer grown at a temperature between about 700 and 1150° C. in a silane ambient or a polysilicon layer deposited via LPCVD procedures at about 575 to 650° C. using silane as a source. In addition, the semiconductor layer 20, later to be formed into active regions, can be incorporated with p-type dopant such as B or n-type dopant such as P and As to alter the conductivity type depending on the intended application.

FIG. 5 shows a step of planarizing the blanket semiconductor layer 20 to the surface of the isolation mesas 16a, 16b, 16c. The semiconductor layer 20 can be planarized by an etch back or the well-known chemical-mechanical polishing (CMP) process. Preferably, a CMP process is performed to planarize the semiconductor layer 20 using the nitride layer 14 as a polishing stop. Thereby, the residual portions of the semiconductor layer are left in the form of a plurality of semiconductor regions 20a, 20b, 20c, 20d separated by intervening isolation mesas 16a, 16b, 16c. Accordingly, the semiconductor regions 20a, 20b, 20c, 20d can serve as active regions for semiconductor devices to form thereupon while the isolation mesas 16a, 16b, 16c can function as isolation regions to electrically isolate the adjacent active regions.

Figure 6:
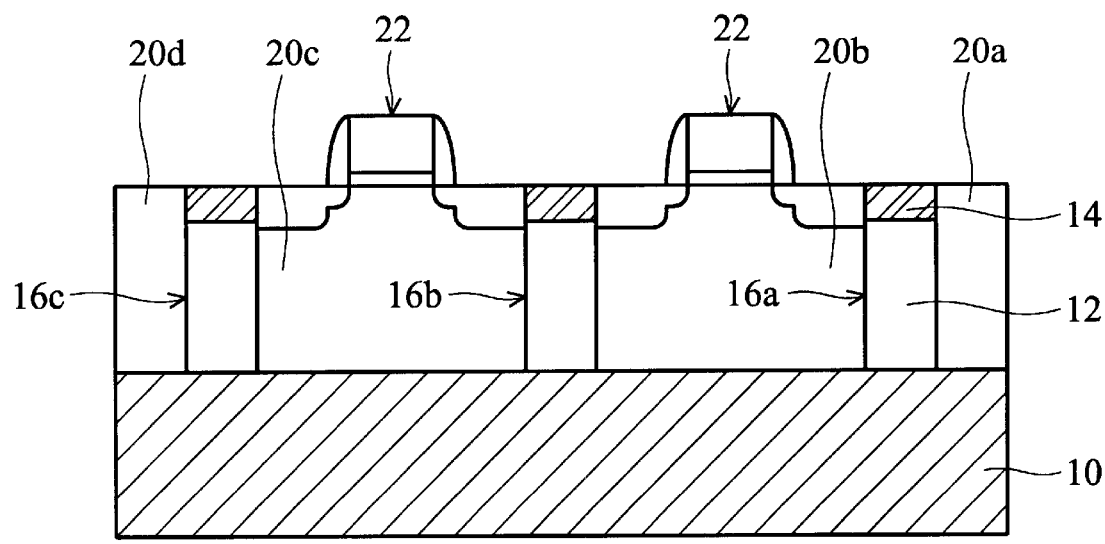

Following this, device components such as MOS transistors, resistors, logic devices, and the like can be fabricated on the active regions 20a, 20b, 20c, 20d through methods known in the semiconductor manufacturing art. FIG. 6 shows an illustrative example where MOS devices 22 are fabricated on the active regions 20b, 20c.

It should be noted that because the isolation regions 16a, 16b, 16c are formed by etching an isolation layer 16 rather than by refilling isolation trenches, the problem of void formation during refill of isolation trenches can be avoided. It also should be noted that, although the above embodiment employs a stack layer of nitride/oxide as the isolation layer 16, the process of the present invention is not limited thereto and may use any suitable dielectric materials as the isolation layer 16.

While the invention has been particularly shown and described with reference to the preferred embodiment thereof, it will be understood by those skilled in the art that various changes in form and details may be made without departing from the spirit and scope of the invention.

What is claimed is:

1. A process for isolating devices on a semiconductor substrate, comprising the steps of:
   forming an isolation layer over the semiconductor substrate;
   patterning the isolation layer to the semiconductor substrate into at least two isolation mesas;
   forming a semiconductor layer over the substrate with a thickness sufficient to cover the isolation mesas; and
   planarizing the semiconductor layer until the isolation mesas are exposed, thereby leaving a semiconductor region between the two isolation mesas to serve as an active region for semiconductor devices.

2. The process as claimed in claim 1, wherein the isolation layer comprises an oxide layer.

3. The process as claimed in claim 2, wherein the isolation layer further comprises a nitride layer overlying the oxide layer.

4. The process as claimed in claim 1, wherein the isolation layer is formed of silicon nitride, silicon carbide, or diamond.

5. The process as claimed in claim 1, wherein the semiconductor layer comprises a polysilicon layer.

6. The process as claimed in claim 1, wherein the semiconductor layer comprises an epitaxial silicon layer.

7. The process as claimed in claim 1, wherein the step of planarizing the semiconductor layer is accomplished by a chemical-mechanical polishing process.

8. The process as claimed in claim 1, wherein the step of planarizing the semiconductor layer is accomplished by an etch back process.

9. A process for isolating devices on a semiconductor substrate, comprising the steps of:
   forming an isolation layer over the semiconductor substrate;
   forming a photoresist layer over the isolation layer;
   patterning the photoresist layer to provide a mask that is substantially the reverse of predetermined active regions to be formed;
   anisotropically etching the isolation layer to the semiconductor substrate with the patterned photoresist layer as an etch mask, thereby forming a plurality of isolation mesas;
   removing the photoresist layer;
   forming a semiconductor layer over the substrate with a thickness sufficient to cover the isolation mesas; and
   planarizing the semiconductor layer until the isolation mesas are exposed, thereby leaving a plurality of semiconductor regions separated by the isolation mesas to serve as active regions for semiconductor devices.

10. The process as claimed in claim 9, wherein the isolation layer comprises an oxide layer.

11. The process as claimed in claim 10, wherein the isolation layer further comprises a nitride layer overlying the oxide layer.

12. The process as claimed in claim 9, wherein the isolation layer is formed of a material selected from the group consisting of silicon nitride, silicon carbide, and diamond.

13. The process as claimed in claim 9, wherein the semiconductor layer comprises a polysilicon layer.

14. The process as claimed in claim 9, wherein the semiconductor layer comprises an epitaxial silicon layer.

15. The process as claimed in claim 9, wherein the step of planarizing the semiconductor layer is accomplished by a chemical-mechanical polishing process.

16. The process as claimed in claim 9, wherein the step of planarizing the semiconductor layer is accomplished by an etch back process.

17. A process for isolating devices on a semiconductor substrate, comprising the steps of:

forming an isolation layer over the semiconductor substrate, the isolation layer being composed of an oxide layer and a nitride layer overlying the oxide layer;

forming a photoresist layer over the isolation layer;

patterning the photoresist layer to provide a mask that is substantially the reverse of predetermined active regions to be formed;

anisotropically etching the isolation layer to the semiconductor substrate with the patterned photoresist layer as an etch mask, thereby forming a plurality of isolation mesas;

removing the photoresist layer;

forming a semiconductor layer over the substrate with a thickness sufficient to cover the isolation mesas; and chemical-mechanical polishing the semiconductor layer using the nitride layer as a polishing stop, thereby leaving a plurality of semiconductor regions separated by the isolation mesas to serve as active regions for semiconductor devices.

* * * * *